United States Patent
Seo et al.

(10) Patent No.: US 9,419,246 B2
(45) Date of Patent: Aug. 16, 2016

(54) ORGANIC LIGHT-EMITTING DISPLAY APPARATUS HAVING INCREASED LIGHT EFFICIENCY

(71) Applicant: SAMSUNG DISPLAY CO., LTD., Yongin, Gyeonggi-Do (KR)

(72) Inventors: Seokhoon Seo, Yongin (KR); Jaehyun Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/617,089

(22) Filed: Feb. 9, 2015

(65) Prior Publication Data

US 2016/0036002 A1    Feb. 4, 2016

(30) Foreign Application Priority Data

Jul. 30, 2014   (KR) ..................... 10-2014-0097617

(51) Int. Cl.
| | |
|---|---|
| *H01L 29/04* | (2006.01) |
| *H01L 29/10* | (2006.01) |
| *H01L 31/00* | (2006.01) |
| *H01L 51/52* | (2006.01) |

(52) U.S. Cl.
CPC ........ *H01L 51/5256* (2013.01); *H01L 51/5237* (2013.01); *H01L 51/5275* (2013.01)

(58) Field of Classification Search
CPC . H01L 51/0545; H01L 27/1214; H01L 27/12; B82Y 10/00
USPC ....................................... 257/40, 59
See application file for complete search history.

(56) References Cited

U.S. PATENT DOCUMENTS

| | | | |
|---|---|---|---|
| 6,206,065 B1 * | 3/2001 | Robbie | ................ C03C 17/001 156/314 |
| 8,154,197 B2 | 4/2012 | Jun et al. | |

(Continued)

FOREIGN PATENT DOCUMENTS

| | | |
|---|---|---|
| KR | 10-2004-0010918 A | 2/2004 |
| KR | 10-2005-0042705 A | 5/2005 |
| KR | 10-2009-0126955 | 12/2009 |

(Continued)

OTHER PUBLICATIONS

Taschuk et al. Glancing Angle Deposition, Chapter 13, pp. 621-671. 2010.

(Continued)

*Primary Examiner* — Lex Malsawma
*Assistant Examiner* — Eric Jones
(74) *Attorney, Agent, or Firm* — Lee & Morse, P.C.

(57) ABSTRACT

An organic light-emitting display apparatus includes a capping layer above an organic emission layer, an encapsulating layer encapsulating the capping layer and the organic emission layer, and a deposition layer above the capping layer and below the encapsulating layer, the deposition layer including a surface on which a plurality of cylinders are located.

14 Claims, 2 Drawing Sheets

(56) References Cited

U.S. PATENT DOCUMENTS

| | | | |
|---|---|---|---|
| 8,547,015 B2 | 10/2013 | Wolk et al. | |
| 2004/0183433 A1* | 9/2004 | Cho | H01L 51/5262 313/504 |
| 2004/0252931 A1* | 12/2004 | Belleville | G02B 6/4214 385/14 |
| 2005/0116625 A1* | 6/2005 | Park | H01L 51/5275 313/504 |
| 2012/0183690 A1* | 7/2012 | Titulaer | B82Y 10/00 427/256 |
| 2013/0087824 A1* | 4/2013 | Van Den Brand | H01L 51/448 257/99 |
| 2013/0236713 A1* | 9/2013 | Park | H01L 31/03923 428/216 |
| 2013/0328479 A1* | 12/2013 | Jung | G02B 5/0278 313/504 |
| 2013/0330505 A1* | 12/2013 | Park | H01L 51/5268 428/131 |

FOREIGN PATENT DOCUMENTS

| | | |
|---|---|---|
| KR | 10-2013-0075428 A | 7/2013 |
| KR | 10-2014-0015270 | 2/2014 |

OTHER PUBLICATIONS

Xi et al. Very Low-Refractive-Index Optical Thin Films Consisting of an Array of SIO2 Nanorods, Optic Letters, Mar. 1, 2006, vol. 31, No. 5.

Robbie et al. Advanced Techniques for Glancing Angle Deposition, J. Vac. Sci. Technol B 16(3), May/Jun. 1998.

* cited by examiner

ORGANIC LIGHT-EMITTING DISPLAY APPARATUS HAVING INCREASED LIGHT EFFICIENCY

CROSS-REFERENCE TO RELATED APPLICATION

Korean Patent Application No. 10-2014-0097617, filed on Jul. 30, 2014, in the Korean Intellectual Property Office, and entitled: "Organic Light-Emitting Display Apparatus," is incorporated by reference herein in its entirety.

BACKGROUND

1. Field

Embodiments relate to an organic light-emitting display apparatus.

2. Description of the Related Art

Organic light-emitting display apparatuses are self-emitting type display apparatuses which display images by using an included organic light-emitting device. Unlike liquid crystal display apparatuses, organic light-emitting display apparatuses do not need an additional light source. Thus, the thickness and weight of the organic light-emitting display apparatuses may be relatively reduced. Also, organic light-emitting display apparatuses have low power consumption, high brightness, and high response rates, thereby drawing attention as next generation display apparatuses.

In general, the organic light-emitting device includes a hole injection electrode, an organic emission layer, and an electron injection electrode. The organic light-emitting device emits light by energy generated when excitons, which are generated by holes injected from the hole injection electrode and electrons injected from the electron injection electrode being united in the organic emission layer, fall from an excited state to a ground state.

SUMMARY

Embodiments are directed to an organic light-emitting display apparatus, including a capping layer above an organic emission layer, an encapsulating layer encapsulating the capping layer and the organic emission layer, and a deposition layer above the capping layer and below the encapsulating layer, the deposition layer including a surface on which a plurality of cylinders are located.

The plurality of cylinders may be perpendicular to the deposition layer.

The plurality of cylinders may be tilted at a predetermined angle.

A refractive index of the deposition layer may be smaller than a refractive index of the capping layer.

A difference between the refractive index of the capping layer and the refractive index of the deposition layer may be equal to or greater than 0.8.

The plurality of cylinders may be spaced apart from one another by a predetermined gap.

The deposition layer may be formed by using an oblique angle deposition (OAD) method or a glancing angle deposition (GLAD) method.

The deposition layer may have a refractive index of about 1.0 to about 1.1.

The deposition layer may be a $SiO_2$ layer.

The encapsulating layer may be an organic and inorganic thin film compound layer in which an organic layer and an inorganic layer are alternately stacked.

The capping layer may have a refractive index of about 1.8 to about 2.3.

Embodiments are also directed to an organic light-emitting display apparatus including a capping layer, an encapsulating layer, and a deposition layer above the capping layer and below the encapsulating layer, the deposition layer including a surface on which a plurality of cylinders are formed. The plurality of cylinders may be spaced apart from one another by a predetermined gap and may be tilted at a predetermined angle.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
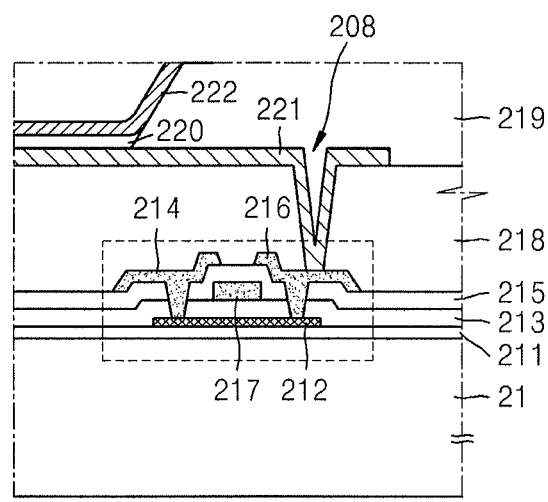
FIG. 1 illustrates, in detail, portions below a capping layer in an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

It will be understood that although the terms "first," "second," etc. may be used herein to describe various components, these components should not be limited by these terms. These components are only used to distinguish one component from another.

FIG. 1 illustrates, in detail, portions below a capping layer in an organic light-emitting display apparatus according to an embodiment.

Referring to FIG. 1, the organic light-emitting display apparatus may include a substrate 21, an organic light-emitting device (OLED) and a pixel-defining layer 219 including a plurality of inorganic layers. The organic light-emitting display apparatus may further include a buffer layer 211, a thin film transistor (TR), and a planarization layer 218.

The substrate 21 may be formed of a suitable material, such as a transparent glass material mainly including $SiO_2$, a ceramic material, a transparent plastic or a metal material.

The buffer layer 211 may prevent impurity ions from spreading on a surface of the substrate 21, may prevent water or external materials from penetrating into the substrate 21, and may planarize the surface of the substrate 21. In some embodiments, the buffer layer 211 may be formed of an inorganic material, such as silicon oxide, silicon nitride, silicon oxynitride, aluminum oxide, aluminum nitride, titanium oxide, or titanium nitride, an organic material, such as polyimide, polyester, or acryl, or a stack of the inorganic material and the organic material. The buffer layer 211 may be omitted if desired. The buffer layer 211 may be formed by a suitable deposition method, such as plasma enhanced chemical vapor deposition (PECVD), atmospheric pressure chemical vapor deposition (APCVD), or low pressure chemical vapor deposition (LPCVD).

The TR may have a suitable structure such as a top gate structure or bottom gate structure. For example, the TR may be formed of an active layer 212, a gate electrode 217, a source electrode 216, and a drain electrode 214. A gate insulating layer 213 may be interposed between the gate electrode 217 and the active layer 212 to insulate the gate electrode 217 and the active layer 212.

In a top gate structure, the active layer 212 may be formed on the buffer layer 211. The active layer 212 may be formed of an inorganic semiconductor, such as amorphous silicon or poly silicon, or an organic semiconductor. In some implementations, the active layer 212 may be formed of an oxide semiconductor. For example, the oxide semiconductor may include an oxide of a material selected from metallic elements in groups 12, 13, and 14, such as Zn, In, Ga, Sn, Cd, Ge, or Hf, and a combination thereof.

The gate insulating layer 213 may be formed on the buffer layer 211 to cover the active layer 212. The gate electrode 214 may be formed on the gate insulating layer 213.

An interlayer insulating layer 215 may be formed on the gate insulating layer 213 to cover the gate electrode 214. The source electrode 216 and the drain electrode 217 may be formed on the interlayer insulating layer 215 to contact the active layer 212 through a contact hole.

In other implementations, the TR may be formed having a bottom gate structure in which the gate electrode 214 is arranged below the active layer 212.

A pixel circuit (not shown) including a capacitor may be formed, along with the TR.

The planarization layer 218 may be formed on the interlayer insulating layer 215 and may cover the TR. The planarization layer 218 may planarize the layers to increase an emission efficiency of the OLED which is to be formed above the planarization layer 218. The planarization layer 218 may have a through-hole 208 through which a portion of the drain electrode 217 is exposed.

The planarization layer 218 may be formed as an insulating layer. For example, the planarization layer 218 may be formed as a single layer or as multiple layers by using an inorganic material, an organic material, or an organic/inorganic compound material, by various deposition methods. In some embodiments, the planarization layer 218 may be formed of at least one material selected from a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

Any one of the planarization layer 218 and the interlayer insulating layer 215 may be omitted as desired.

The OLED may be arranged on the planarization layer 218. The OLED may include a first electrode 221, an intermediate layer 220 including an organic emission layer, and a second electrode 222. The pixel-defining layer 219 may be arranged on the substrate 21 and on the first electrode 221 and may include an opening that exposes the center of the first electrode 221.

The intermediate layer 220 may be formed of a low molecular weight organic material or a high molecular weight organic material. When the intermediate layer 220 is formed of the low molecular weight organic material, the intermediate layer 220 may include the organic emission layer, and may further include, for example, at least one of a hole injection layer (HIL), a hole transport layer (HTL), an electron transport layer (ETL), and an electron injection layer (EIL), in addition to the organic emission layer. The intermediate layer 220 may include the organic emission layer and may further include various other functional layers. The low molecular weight organic material may be formed by using a vapor deposition method. The organic emission layer may be formed separately for a red (R), green (G), or blue (B) pixel. The HIL, HTL, ETL, and EIL may be common layers that are commonly applied to the R, G, and B pixels.

When the intermediate layer 220 is formed of the high molecular weight organic material, the intermediate layer 220 may include the HTL in a direction of the first electrode 221 based on the organic emission layer. The HTL may be formed above the first electrode 221 by an inkjet printing or spin coating method. The intermediate layer 220 may be arranged so as to extend along a side wall of the pixel-defining layer 219.

The first electrode 221 may be arranged on the planarization layer 218 to be electrically connected to a drain electrode 216 of a thin film transistor (TR) via the through hole 208 penetrating the planarization layer 218.

The first electrode 221 may function as an anode electrode and the second electrode 222 may function as a cathode electrode. In other implementations, the polarities of the first and second electrodes 221 and 222 may be switched.

When the first electrode 221 functions as the anode electrode, the first electrode 221 may include ITO, IZO, ZnO, or $In_2O_3$ having a high work function. When the organic light-emitting display apparatus is a top-emission type in which an image is provided in a direction opposite to the substrate 21, the first electrode 221 may further include a reflective layer including Ag, Mg, Al, Pt, Pd, Au, Ni, Nd, Ir, Cr, Li, Yb, or Ca. The above materials may be used alone or in combination. The first electrode 221 may be formed as a single-layered structure or a multi-layered structure including the above described metal and/or metal alloys. In some implementations, the first electrode 221 may be a reflective electrode and may include an ITO/Ag/ITO structure.

When the second electrode 222 functions as the cathode electrode, the second electrode 222 may be formed of a metal, such as Ag, Mg, Al, Pt, Pd, Au, Ni, Nd, Ir, Cr, Li, or Ca. When the organic light-emitting display apparatus is a top-emission type, the second electrode 222 may include a transparent conductive metal oxide, such as ITO, IZO, ZTO, ZnO, or $In_2O_3$ such that light may be transmitted.

In other implementations, the second electrode 222 may be formed as a thin layer including at least one material selected from Li, Ca, LiF/Ca, LiF/Al, Al, Ag, Mg, and Yb. For example, the second electrode 222 may be formed as a single layer or a stack including Mg:Ag, Ag:Yb, and/or Ag. Unlike the first electrode 221, the second electrode 222 may be formed such that a common voltage may be applied to all pixels.

The pixel-defining layer 219 may include a plurality of openings exposing the first electrode 221. The pixel-defining layer 219 may define a pixel area (PA) and a non-pixel area (NPA) of the OLED. The first electrode 221, the intermediate layer 220, and the second electrode 222 may be sequentially stacked in the opening of the pixel-defining layer 219 such that the intermediate layer 220 may emit light. The second electrode 222 may be formed above the intermediate layer 220 and above the pixel-defining layer 219. The portion in which the pixel-defining layer 219 is formed may be substantially the NPA and the opening of the pixel-defining layer 219 may be substantially the PA.

Figure 2:
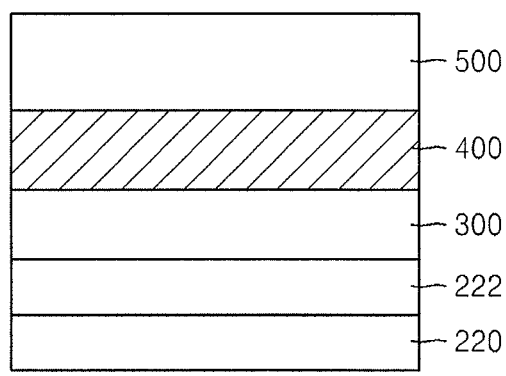
FIG. 2 illustrates a cross-sectional view of portions above a second electrode in an organic light-emitting display apparatus according to an embodiment.
Figure 3:
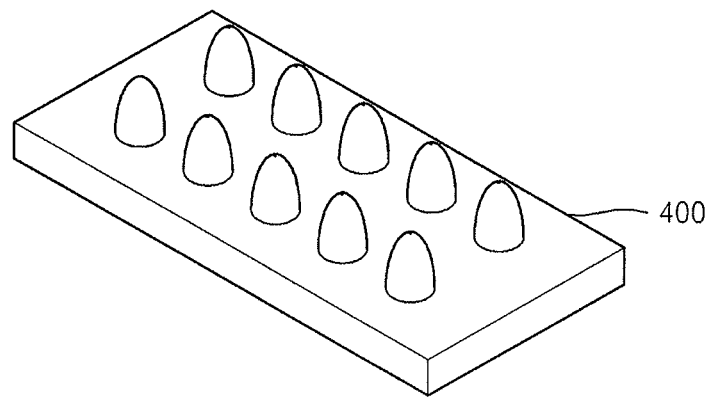
FIGS. 3 and 4 illustrate enlarged views of a deposition layer of an organic light-emitting display apparatus according to an embodiment.
Figure 4:
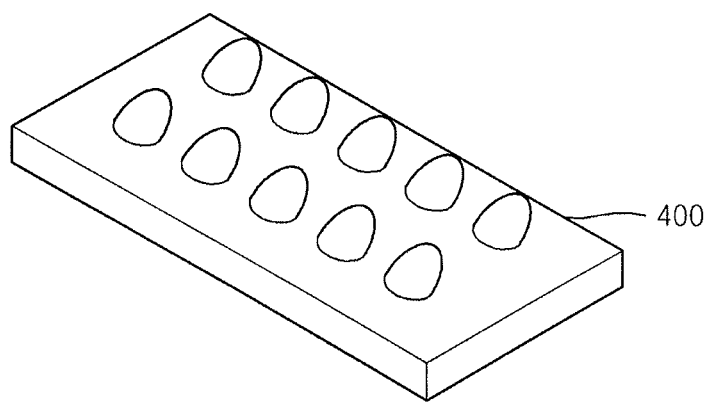

FIG. 2 illustrates a cross-sectional view of elements disposed above a second electrode in an organic light-emitting display apparatus according to an embodiment. FIGS. 3 and 4 are enlarged views of a deposition layer of an organic light-emitting display apparatus according to an embodiment.

As illustrated in FIG. 2, the organic light-emitting display apparatus may include the intermediate layer 220 formed on the substrate 21 and the second electrode 222 formed above the intermediate layer 220.

The organic light-emitting display apparatus may further include a capping layer 300 above the second electrode 222.

The capping layer 300 may be formed above the OLED. The capping layer 300 may protect the OLED and, at the same time, may efficiently transmit light generated in the intermediate layer 220 included in the OLED toward the outside.

The capping layer 300 may increase an extraction rate of light emitted from the OLED to increase light efficiency of the organic light-emitting display apparatus. The capping layer 300 may be formed of an organic layer, an inorganic layer, or an organic layer including inorganic particles.

An inorganic material that may be included in the capping layer 300 may be, for example, zinc oxide, titanium oxide, zirconium oxide, silicon nitride, niobium oxide, tantalum oxide, tin oxide, nickel oxide, indium nitride, or gallium nitride.

An organic material that may be included in the capping layer 300 may be a polymer. For example, the organic material included in the capping layer 300 may be acryl, polyimide, or polyamide.

For example, the organic material included in the capping layer 300 may be poly(3,4-ethylenedioxythiophene) (PEDOT), 4,4'-bis[N-(3-methyl phenyl)-N-phenyl amino]biphenyl (TPD), 4,4',4"-tris[(3-methyl phenyl)phenyl amino]triphenylamine (m-MTDATA), 1,3,5-tris[N,N-bis(2-methyl phenyl)-amino]-benzene (o-MTDAB), 1,3,5-tris[N,N-bis(3-methyl phenyl)-amino]-benzene (m-MTDAB), 1,3,5-tris[N,N-bis(4-methyl phenyl)-amino]-benzene (p-MTDAB), 4,4'-bis[N,N-bis(3-methyl phenyl)-amino]-diphenyl methane (BPPM), 4,4',4"-tris(N-carbazole)triphenylamine (TCTA), or 3-(4-biphenyl)-4-phenyl-5-t-butylphenyl-1,2,4-triazole (TAZ).

The organic light-emitting display apparatus according to the present embodiment may further include an encapsulating layer 500 above the capping layer 300.

The encapsulating layer 500 may encapsulate the capping layer 300 and the OLED, arranged below the encapsulating layer 500, to protect the OLED from water and oxygen.

The organic light-emitting display apparatus may further include a deposition layer 400, which is arranged above the capping layer 300 and below the encapsulating layer 500.

The deposition layer 400 may be formed of an inorganic layer or an organic layer. The forming of the deposition layer 400 will be described in detail below.

An inorganic material that may be used in the deposition layer 400 may be, for example, silicon oxide or magnesium fluoride.

An organic material that may be used in the deposition layer 400 may be a polymer. As examples, the organic material that may be used in a low refractive layer may be an acrylic polymer, a polyimide, a polyamide, or Alq3 (tris(8-hydroxyquinolinato)aluminum).

The deposition layer 400 may be formed between the capping layer 300 and the encapsulating layer 500 as illustrated in FIG. 2. As illustrated in FIGS. 3 through 4, the capping layer 300 may be formed to have a surface on which a plurality of cylinders are formed.

When the deposition layer 400 is formed to have the surface on which the plurality of cylinders are formed, the refractive index may be increased. This increase may occur because when light passes through the deposition layer 400, the light is refracted due to the cylinder shape of the surface of the deposition layer 400 such that the direction in which light progresses changes.

In a comparative method of forming an organic light-emitting display apparatus, such as a flexible organic light-emitting apparatus, only a layer such as an LiF layer is formed above a capping layer and a deposition layer is not formed. In such a case, the refractive index of the deposition layer may be low, and a difference of the refractive index between the deposition layer and the capping layer may be small. Thus, resonance efficiency may be low.

In the organic light-emitting display apparatus according to the present embodiment, the deposition layer 400 is formed above the capping layer 300. The deposition layer 400 is deposited such that the surface thereof has the plurality of cylinders. Thus, the refractive index of the deposition layer 400 may be increased.

When the refractive index of the deposition layer 400 is increased, the difference between the refractive index of the deposition layer 400 and the refractive index of the capping layer 300 placed below the deposition layer 400 may be increased. In this case, a resonance effect of the organic light-emitting display apparatus on the light coming from the outside may be increased, thereby increasing the efficiency of the organic light-emitting display apparatus.

Due to the difference between the refractive index of the deposition layer 400 and the refractive index of the capping layer 300, a portion of the light released from the OLED may penetrate the deposition layer 400 through the capping layer 300, and the remaining portion of the light may be reflected at an interface between the capping layer 300 and the deposition layer 400.

The light reflected at the interface between the capping layer 300 and the deposition layer 400 may be reflected again in the first electrode 221 or the second electrode 222 so as to be amplified due to repeated reflection.

Also, the light may be amplified by repeated reflections in the capping layer 300 and the deposition layer 400. The light may be repeatedly reflected at the interface between the capping layer 300 and the deposition layer 400.

By such a resonance effect, the organic light-emitting display apparatus according to embodiments may effectively amplify light and increase light efficiency.

In a general organic light-emitting display apparatus that is rigid, a glass substrate may be formed above the capping layer, and thus, air may enter into a space between the capping layer and the glass substrate. The refractive index of air is 1.0 and a difference between the refractive index of air and the refractive index of the below capping layer may be maintained at a certain level.

However, in order to provide a flexible organic light-emitting display apparatus, the encapsulating layer, instead of the glass substrate, may be formed above the capping layer to increase the flexibility of the organic light-emitting display apparatus. A LiF layer formed between the encapsulating layer and the capping layer generally may have a higher refractive index than air (refractive index 1.0).

Thus, the difference between the refractive index of the LiF layer and the refractive index of the capping layer formed below the LiF layer may be decreased compared to a non-flexible organic light-emitting display, and thus, the resonance efficiency of light may be reduced. As a result, the light efficiency may decrease.

In the organic light-emitting display apparatus according to the present embodiment, the deposition layer 400 may be formed above the capping layer 300. For example, the deposition layer 400 may be formed to have the surface on which the plurality of cylinders are formed, thereby increasing the refractive index. Thus, even the flexible organic light-emitting display apparatus may have the same light efficiency as the rigid organic light-emitting display apparatus.

In the organic light-emitting display apparatus according to the present embodiment, the difference between the refractive index of the deposition layer 400 and the refractive index of the capping layer 300 may be equal to or higher than 0.8.

Since the refractive index of air is 1.0 as described above, the difference between the refractive index of air and the refractive index of the below capping layer, in the rigid organic light-emitting display apparatus, may remain around 0.8.

According to the present embodiment, the organic light-emitting display apparatus may be formed such that the difference between the refractive index of the deposition layer 400 and the refractive index of the capping layer 300 below the deposition layer 400 may be at least 0.8 or more, in order to increase the light efficiency thereof.

The cylinder shapes formed on the surface of the deposition layer 400 may be perpendicular to the deposition layer 400, as illustrated in FIG. 3. In other implementations, the cylinder shapes formed on the surface of the deposition layer 400 may be tilted at a predetermined angle, as illustrated in FIG. 4.

When the cylinder shapes formed on the surface of the deposition layer 400 are tilted at the predetermined angle as illustrated in FIG. 4, the cylinder shapes may be spaced apart from each other by a predetermined gap so that neighboring cylinder shapes do not contact each other.

The plurality of cylinder shapes may be arranged such that gaps are formed between cylinder shapes. As a result, a predetermined gap may be formed between each pair of cylinder shapes.

When the cylinder shapes are vertical with respect to the deposition layer 400 as illustrated in FIG. 3, there is little probability that the neighboring cylinder shapes contact each other even when only a small amount of space is maintained between each pair of cylinder shapes. Even when the cylinder shapes are perpendicular to the deposition layer 400, the cylinder shapes may also be formed to be spaced apart from each other so that there is a predetermined space maintained between each pair of cylinder shapes.

The deposition layer 400 may be formed to have the surface including the plurality of cylinder shapes. The plurality of cylinder shapes may be tilted with respect to the deposition layer 400 at a predetermined angle ranging from 0° to 90°. When the cylinder shapes are formed to be tilted at a 90° angle with respect to the deposition layer 400, the cylinder shapes may be formed to be perpendicular to the deposition layer 400. In this case also, the cylinder shapes may be formed to be spaced apart from each other by a predetermined gap.

When the cylinder shapes are arranged to be spaced apart from one another by a predetermined gap, due to spaces generated between the cylinder shapes, the cylinder shapes formed on the surface of the deposition layer 400 may be sparse. That is, the surface of the deposition layer 400 may be porous.

When the cylinder shapes formed on the surface of the deposition layer 400 are sparse, the resulting effect may be the same as that obtained when an empty space exists between the capping layer and the encapsulating layer, when viewed over a long period of time.

The empty space, that is, the air, has a refractive index of 1.0. Thus, considering that whichever layer is deposited, the layer 400 of cylinder shapes may have a refractive index of more than approximately 1.4, and the refractive index of the deposition layer 400 may be approximately similar to the refractive index of the air, when the cylinder shapes formed on the surface of the deposition layer 400 are sparse.

In the organic light-emitting display apparatus according to the present embodiment, the cylinder shapes may be sparsely arranged on the surface of the deposition layer 400. The difference between the refractive indexes of the deposition layer 400 and the capping layer 300 may increase and the light efficiency may be maximized.

When depositing the deposition layer 400, a plurality of very small cylinder shapes may be formed on the surface of the deposition layer 400. When the cylinder shapes decrease in size, a higher number of cylinder shapes may be formed.

The cylinder shapes are not limited to a particular size. However, when the cylinder shapes described above are formed to be very small, e.g., nano-sized, a higher number of cylinder shapes may be formed, even when the cylinder shapes are formed to be tilted at a predetermined angle and spaced apart from one another by a predetermined gap. When depositing the deposition layer 400, a plurality of very small cylinder shapes may be formed.

In the depositing of the deposition layer 400 according to the present embodiment, an OAD deposition method or a GLAD deposition method may be used.

In the organic light-emitting display apparatus according to the present embodiment, the refractive index of the deposition layer 400 may be 1.0 to 1.1 such that the deposition layer 400 may have a refractive index similar to a refractive index of air existing above the capping layer in an organic light-emitting display apparatus, to maintain the difference between the refractive index of the deposition layer 400 and the refractive index of the capping layer 300 below the deposition layer 400.

In other implementations, the refractive index of the deposition layer 400 may vary as long as a difference between the refractive index of the deposition layer 400 and the refractive index of the capping layer 300 below the deposition layer 400 is maintained.

In the organic light-emitting display apparatus according to the present embodiment, the deposition layer 400 may be formed of a suitable material that forms the cylinder shapes on the surface of the deposition layer 400. For example, the material may be a $SiO_2$ layer.

The deposition layer 400 may be formed of an organic layer or an inorganic layer. In addition to the $SiO_2$ layer, the deposition layer may be formed of a material having a refractive index similar to a refractive index of the $SiO_2$ layer.

In the organic light-emitting display apparatus according to embodiments, the refractive index of the capping layer 300 may be varied as desired to maximize light efficiency. For example, the refractive index of the capping layer 300 may be 1.8 to 2.3.

In some implementations, the capping layer 300 may be replaced by another layer having the refractive index of 1.8 to 2.3. In this case also, the difference between the refractive index of the deposition layer 400 and the other layer may be the same as the difference between the refractive index of the deposition layer 400 and the refractive index of the capping layer 300 when the capping layer 300 is formed. Thus, light efficiency obtained when the capping layer 300 is replaced by another layer may be similar to that obtained when the capping layer 300 is not replaced.

Suitable materials may be used for the capping layer 300 and the deposition layer 400 as long as the plurality of cylinder shapes are formed on the surface of the deposition layer 400 and the difference of the refractive index is maintained at a predetermined level.

The encapsulating layer 500 may encapsulate the deposition layer 400 and protect the lower layers, including the organic emission layer, from water and oxygen.

The encapsulating layer 500 may be formed of a glass substrate or an inorganic layer. For example, the encapsulating layer 500 may be formed as an organic and inorganic thin film compound layer in which an organic layer and an inorganic layer are alternately stacked.

An inorganic layer may effectively protect the OLED from external water and oxygen. However, since an inorganic layer is not flexible, it may be difficult to use the inorganic layer in the flexible organic light-emitting display apparatus. An organic layer is typically flexible. Accordingly, an organic layer may be used in the flexible organic light-emitting display apparatus. However, the organic layer may be vulnerable to external water and oxygen. Accordingly, it may be difficult to use the organic layer as the encapsulating layer.

The encapsulating layer 500 may be formed of an organic and inorganic thin film compound layer in which the organic layer and the inorganic layer are alternately stacked, to prevent external water and oxygen from penetrating into the substrate and maintain flexibility.

By way of summation and review, to increase the usability of an organic light-emitting display apparatus, a method to improve light efficiency by effectively extracting light generated in the organic emission layer is desirable.

According to the one or more of the above embodiments, an organic light-emitting display apparatus with improved light efficiency is provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display apparatus, comprising:
    a capping layer above an organic emission layer;
    an encapsulating layer encapsulating the capping layer and the organic emission layer; and
    a deposition layer above the capping layer and below the encapsulating layer, the deposition layer including a surface on which a plurality of cylinders are located,
    wherein the plurality of cylinders are non-concentric with each other.

2. The organic light-emitting display apparatus as claimed in claim 1, wherein the plurality of cylinders are perpendicular to the deposition layer.

3. The organic light-emitting display apparatus as claimed in claim 1, wherein the plurality of cylinders are tilted at a predetermined angle.

4. The organic light-emitting display apparatus as claimed in claim 1, wherein a refractive index of the deposition layer is smaller than a refractive index of the capping layer.

5. The organic light-emitting display apparatus as claimed in claim 4, wherein a difference between the refractive index of the capping layer and the refractive index of the deposition layer is equal to or greater than 0.8.

6. The organic light-emitting display apparatus as claimed in claim 4, wherein a resonance effect of the organic light-emitting display apparatus on the light coming from the outside is increased.

7. The organic light-emitting display apparatus as claimed in claim 1, wherein the plurality of cylinders are spaced apart from one another by a predetermined gap.

8. The organic light-emitting display apparatus as claimed in claim 1, wherein the deposition layer is formed by using an oblique angle deposition (OAD) method or a glancing angle deposition (GLAD) method.

9. The organic light-emitting display apparatus as claimed in claim 1, wherein the deposition layer has a refractive index of about 1.0 to about 1.1.

10. The organic light-emitting display apparatus as claimed in claim 1, wherein the deposition layer is a $SiO_2$ layer.

11. The organic light-emitting display apparatus as claimed in claim 1, wherein the encapsulating layer is an organic and inorganic thin film compound layer in which an organic layer and an inorganic layer are alternately stacked.

12. The organic light-emitting display apparatus as claimed in claim 1, wherein the capping layer has a refractive index of about 1.8 to about 2.3.

13. The organic light-emitting display apparatus as claimed in claim 1, wherein light passing through the deposition layer is refracted due to the plurality of cylinders of the surface of the deposition layer such that the direction in which light progresses changes.

14. An organic light-emitting display apparatus, comprising:
    a capping layer;
    an encapsulating layer;
    a deposition layer above the capping layer and below the encapsulating layer, the deposition layer including a surface on which a plurality of cylinders are formed,
    wherein the plurality of cylinders are spaced apart from one another by a predetermined gap, are tilted at a predetermined angle, and are non-concentric with each other.

* * * * *